United States Patent
Magdefrau et al.

(10) Patent No.: US 10,450,643 B2
(45) Date of Patent: *Oct. 22, 2019

(54) MATERIAL JOINING

(71) Applicant: Hamilton Sundstrand Corporation, Charlotte, NC (US)

(72) Inventors: Neal Magdefrau, Tolland, CT (US); Paul Sheedy, Bolton, CT (US); Sonia Tulyani, Glastonbury, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 132 days.

This patent is subject to a terminal disclaimer.

(21) Appl. No.: 15/209,550

(22) Filed: Jul. 13, 2016

(65) Prior Publication Data

US 2018/0016671 A1  Jan. 18, 2018

(51) Int. Cl.
| | | |
|---|---|---|
| *C23C 4/06* | (2016.01) | |
| *C22C 45/00* | (2006.01) | |
| *C23C 4/12* | (2016.01) | |
| *B29C 65/02* | (2006.01) | |
| *B29C 65/70* | (2006.01) | |

(Continued)

(52) U.S. Cl.
CPC .............. *C23C 4/12* (2013.01); *B23K 20/16* (2013.01); *B23K 35/00* (2013.01); *B29C 65/02* (2013.01); *B29C 65/70* (2013.01); *C22C 45/00* (2013.01); *C23C 4/02* (2013.01); *C23C 4/06* (2013.01); *C23C 4/18* (2013.01); *C23C 14/568* (2013.01);

(Continued)

(58) Field of Classification Search
None
See application file for complete search history.

(56) References Cited

U.S. PATENT DOCUMENTS

| 4,102,033 A | 7/1978 | Emi et al. |
| 4,316,573 A | 2/1982 | DeCristofaro et al. |

(Continued)

FOREIGN PATENT DOCUMENTS

| CA | 2763153 A1 | 7/2012 |
| CN | 104439677 A | 3/2015 |

(Continued)

OTHER PUBLICATIONS

Extended European Search Report dated Oct. 17, 2017, issued during the prosecution of corresponding European Patent Application No. EP 17180756.3 (8 pages).

(Continued)

*Primary Examiner* — George Wyszomierski
(74) *Attorney, Agent, or Firm* — Locke Lord LLP; Scott D. Wofsy; Joshua L. Jones

(57) ABSTRACT

A method of joining includes bringing a bulk metallic glass (BMG) material to a temperature lower than the crystallization temperature of the BMG material and depositing the BMG material onto a first substrate with interlock surface features such that the BMG material interlocks with the interlock surface features of the substrate. The method includes joining a second substrate to the BMG material, wherein the second substrate includes interlock surface features such that the BMG material interlocks with the interlock surface features of both the first and second substrates, joining the first and second substrates together to produce a fully amorphous joint between the first and second substrates.

6 Claims, 3 Drawing Sheets

(51) Int. Cl.
  *C23C 24/04*   (2006.01)
  *B23K 20/16*   (2006.01)
  *B23K 35/00*   (2006.01)
  *F16B 11/00*   (2006.01)
  *C23C 4/02*    (2006.01)
  *C23C 4/18*    (2006.01)
  *C23C 24/08*   (2006.01)
  *C23C 14/56*   (2006.01)
  *F16B 5/07*    (2006.01)

(52) U.S. Cl.
  CPC .............. *C23C 24/04* (2013.01); *C23C 24/08* (2013.01); *F16B 11/00* (2013.01); *F16B 5/07* (2013.01)

(56) References Cited

U.S. PATENT DOCUMENTS

| | | | |
|---|---|---|---|
| 5,482,580 | A | 1/1996 | Scruggs et al. |
| 5,558,789 | A | 9/1996 | Singh |
| 5,620,537 | A | 4/1997 | Bampton |
| 7,947,134 | B2 | 5/2011 | Lohwongwatana et al. |
| 9,174,415 | B2 | 11/2015 | Gong et al. |
| 2003/0024616 | A1 | 2/2003 | Kim et al. |
| 2007/0023489 | A1 | 2/2007 | Swiston et al. |
| 2007/0111119 | A1 | 5/2007 | Hu et al. |
| 2008/0063889 | A1 | 3/2008 | Duckham et al. |
| 2008/0251164 | A1 | 10/2008 | Lohwongwatana et al. |
| 2008/0261029 | A1 | 10/2008 | Andersson |
| 2010/0004373 | A1 | 1/2010 | Zhu et al. |
| 2011/0111213 | A1 | 5/2011 | Es-Souni |
| 2011/0287223 | A1 | 11/2011 | Victor et al. |
| 2013/0037177 | A1 | 2/2013 | Chiang et al. |
| 2014/0011050 | A1 | 1/2014 | Poole et al. |
| 2014/0197664 | A1 | 7/2014 | Ezzat et al. |

FOREIGN PATENT DOCUMENTS

| | | |
|---|---|---|
| KR | 100787929 B1 | 12/2007 |
| WO | 2007/120205 A2 | 10/2007 |
| WO | 2008/124623 A1 | 10/2008 |
| WO | 2013/058754 A1 | 4/2013 |
| WO | WO-2013/048442 A1 | 4/2013 |
| WO | WO-2013/058765 * | 4/2013 |
| WO | 2014200700 A1 | 12/2014 |
| WO | WO-2015198790 A1 | 12/2015 |
| WO | 2016/078099 A1 | 5/2016 |

OTHER PUBLICATIONS

Extended European Search Report dated Apr. 4, 2017, issued during the prosecution of European Patent Application No. EP 16197832.5 (8 pages).

European Office Action dated Nov. 5, 2018, issued during the prosecution of corresponding European Patent Application No. EP 17180756.3 (7 pages).

* cited by examiner

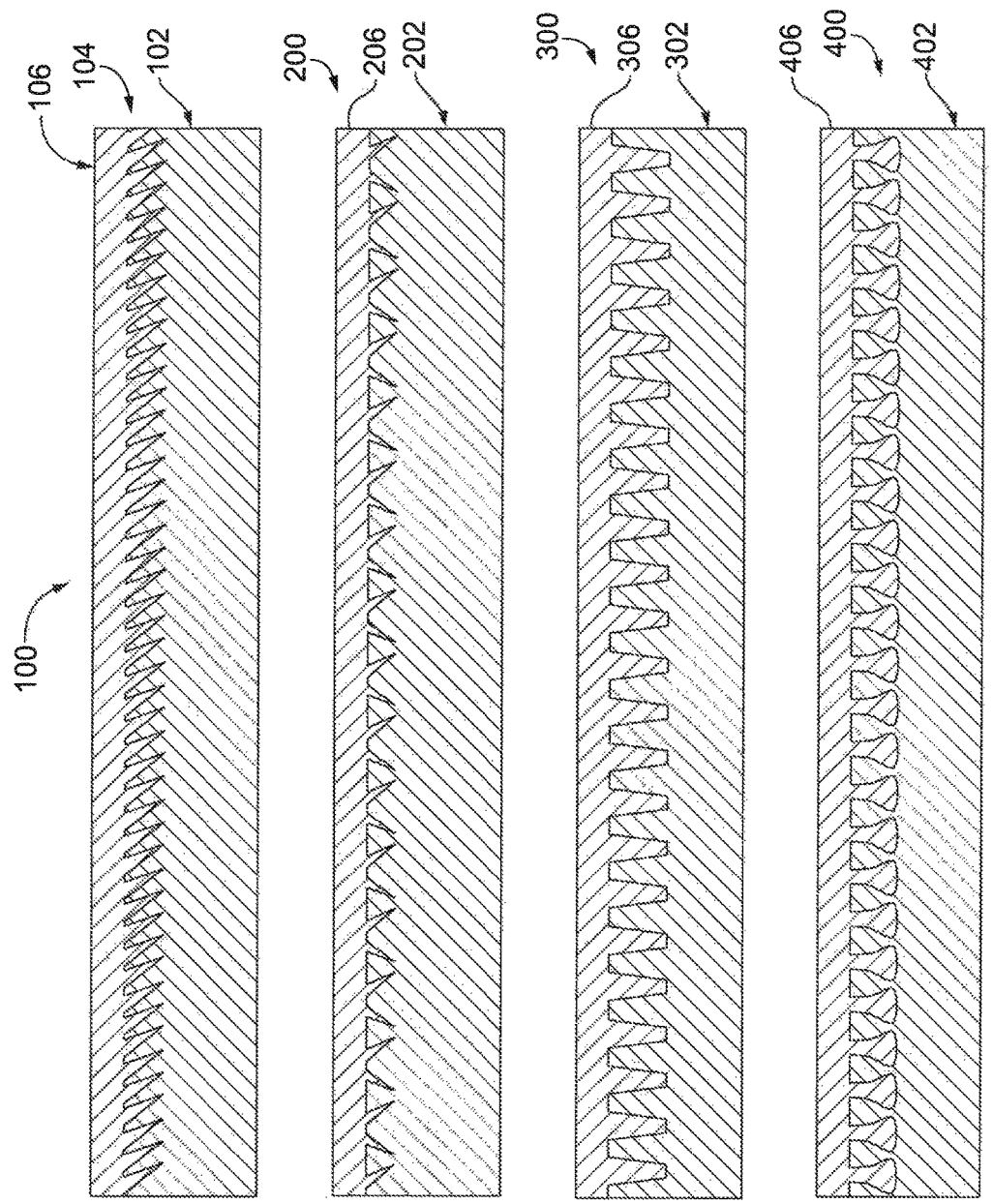

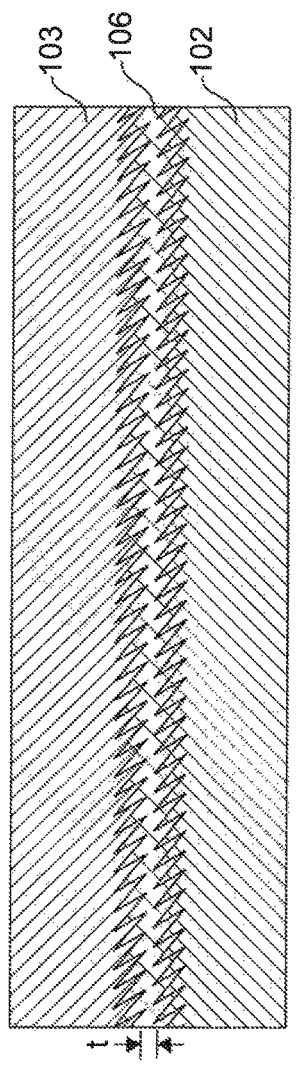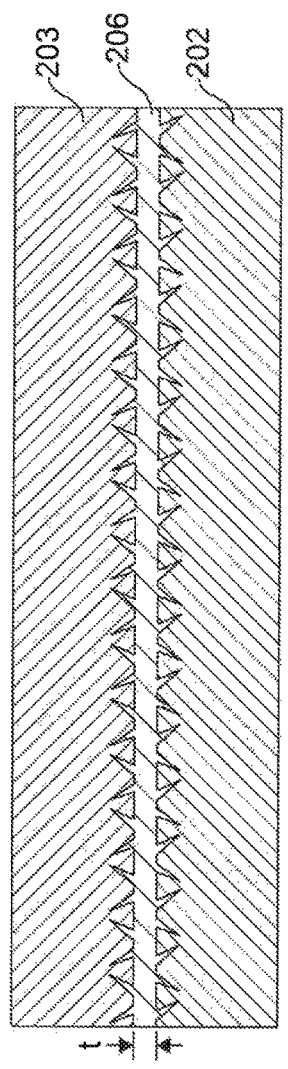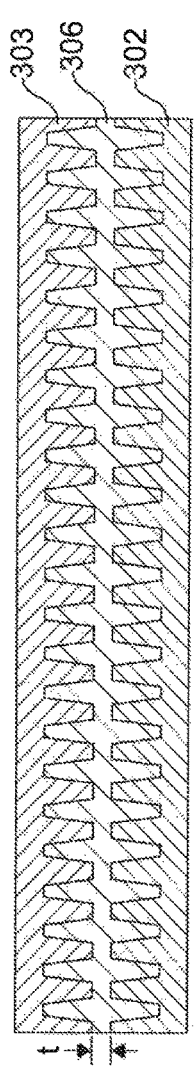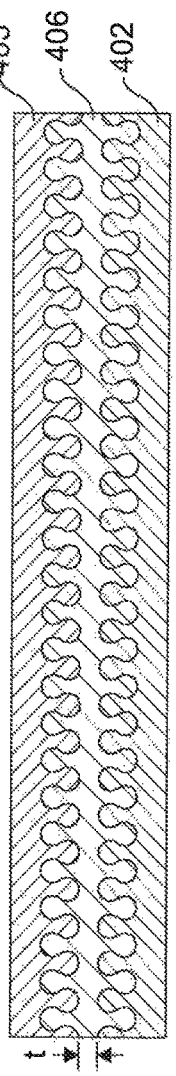

MATERIAL JOINING

BACKGROUND OF THE INVENTION

1. Field of the Invention

The present disclosure relates to joining techniques for materials such as metals, glasses, ceramics, polymers, composites, or combinations thereof.

2. Description of Related Art

Bulk Metallic Glasses (BMG's) are an emerging class of engineering material that can be made stronger than steel, have corrosion resistance, and can have extremely high elastic limits. One limitation that has limited the applications in which BMG's can be used is that known processing constraints have limited at least one dimension of a given BMG component to less than about 30-40 mm (1.2-1.5 inches). Conversely, for components with one at least one dimension less than about 1-2 mm (0.04-0.08 inches), BMG's offer a unique processability in that they can be thermoplastically formed, similar to plastics.

While such methods have generally been acceptable for their intended applications, there is still a need in the art for improved BMG components. The present disclosure provides a solution for this need.

SUMMARY OF THE INVENTION

A method of joining includes bringing a bulk metallic glass (BMG) material to a temperature lower than the crystallization temperature of the BMG material and depositing the BMG material onto a first substrate with interlock surface features such that the BMG material interlocks with the interlock surface features of the substrate. The method includes joining a second substrate to the BMG material, wherein the second substrate includes interlock surface features such that the BMG material interlocks with the interlock surface features of both the first and second substrates, joining the first and second substrates together to produce a fully amorphous joint between the first and second substrates.

The method can include forming the interlock surface features on a surface of at least one of the first or second substrates. Forming the interlock surface features can include forming interlock surface features with receptacles for BMG material that narrow in a direction going deeper within the substrate.

Forming the interlock surface features can include forming interlock surface features with receptacles for BMG material that form a repeating pattern of substantially identical triangular receptacles. It is also contemplated that forming the interlock surface features can include forming interlock surface features with receptacles for BMG material that form an alternating pattern of two sets of different triangular receptacles.

In another aspect, forming the interlock surface features can include forming interlock surface features with receptacles for BMG material that form a repeating pattern of substantially identical truncated triangular receptacles with truncated triangular teeth separating each respective adjacent pair of the receptacles.

It is also contemplated that forming the interlock surface features can include forming interlock surface features with receptacles for BMG material that widen in a direction going deeper within the substrate. Forming the interlock surface features includes forming the receptacles for BMG material between teeth that neck down in a direction going deeper within the substrate, wherein each tooth is symmetrical with respect to neighboring ones of the receptacles. The interlock surface features can include at least one of anodized aluminum or titanium.

Depositing the BMG material can include at least one of thermoplastic forming, rolling, compression molding, hot pressing, autoclaving, thermal spraying, or cold spraying the BMG material onto the substrate such that the BMG material interlocks with the interlocking surface features of the substrate. Bringing the BMG material to a temperature lower than the crystallization temperature of the BMG material can include bringing a BMG material to a temperature greater than or equal to the glass transition temperature of the BMG material and lower than the crystallization temperature of the BMG material.

The method can include depositing a portion of the BMG material onto the second substrate such that the portion of the BMG material interlocks with the interlock surface features of the second substrate prior to joining the first and second substrates. Joining the first and second substrates can include forming a BMG to BMG bond between the portion of the BMG material deposited on the second substrate, and the BMG material deposited on the first substrate.

A system includes a first substrate joined to a second substrate by a BMG material. At least one of the first or second substrates includes interlock surface features. The BMG material interlocks with the interlock surface features. The BMG material can form a layer between the first and second substrates that is less than or equal to 2.0 mm thick.

The interlock surface features can include receptacles in the substrate with BMG material therein, wherein the receptacles narrow in a direction going deeper within the substrate. The interlock surface features can include receptacles for BMG material that form a repeating pattern of substantially identical triangular receptacles. It is also contemplated that the interlock surface features can include receptacles for BMG material that form an alternating pattern of two sets of different triangular receptacles.

In another aspect, the interlock surface features can include receptacles in the substrate with BMG material therein, wherein the receptacles widen in a direction going deeper within the substrate. The receptacles for BMG material can be between teeth that neck down in a direction going deeper within the substrate, wherein each tooth is symmetrical with respect to neighboring ones of the receptacles.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIGS. 5-8 are schematic cross-sectional side elevation views of the substrates of FIGS. 1-4, respectively, showing a Bulk Metallic Glass (BMG) material interlocking with the interlock surface features of a first respective substrate; and FIGS. 9-12 are schematic cross-sectional side elevation views of the substrates of FIGS. 1-4, respectively, showing a Bulk Metallic Glass (BMG) material interlocking with the interlock surface features of a first respective substrate and of a second respective substrate, joining the first and second respective substrates together.

DETAILED DESCRIPTION OF THE PREFERRED EMBODIMENTS

Figure 1:
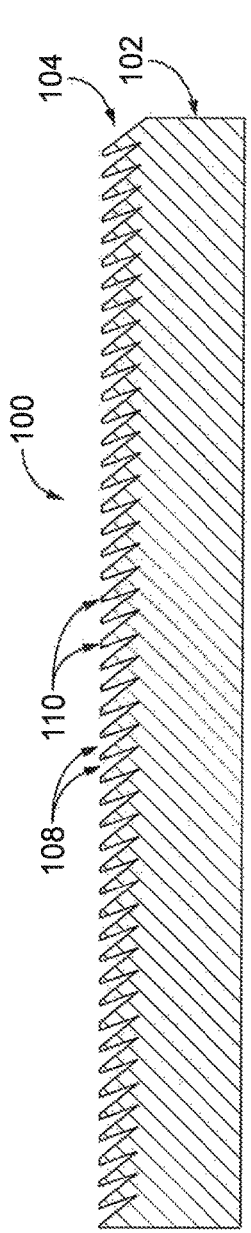
FIGS. 1-4 are schematic cross-sectional side elevation views of four exemplary embodiments of substrates constructed in accordance with the present disclosure, showing four different respective interlock surface features.
Figure 2:
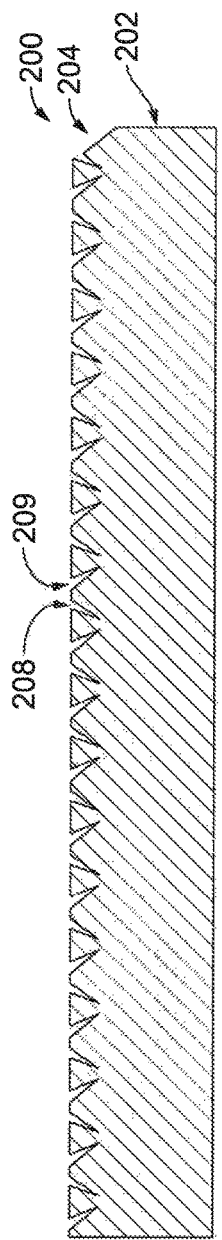

Reference will now be made to the drawings wherein like reference numerals identify similar structural features or aspects of the subject disclosure. For purposes of explanation and illustration, and not limitation, a partial view of an exemplary embodiment of a system in accordance with the disclosure is shown in FIG. 1 and is designated generally by reference character 100. Other embodiments of systems in accordance with the disclosure, or aspects thereof, are provided in FIGS. 2-12, as will be described. The systems and methods described herein can be used to join substrates together to produce a fully amorphous interface for material joining, with the advantageous properties of Bulk Metallic Glass (BMG) materials in the joining process and in the resulting system or structure.

Cladding system 100 includes a first substrate 102 of a material such as a metal, glass, ceramic, polymer, composite, or any other suitable type of material. Substrate 102 is prepared for joining with interlock surface features 104 on a surface thereof. A BMG material 106 is joined to substrate 102, as shown in FIG. 5. The BMG material 106 interlocks with the interlock surface features 104 of the substrate 102, e.g., for a mechanical interlocking engagement. FIG. 1 shows substrate 102 prior to cladding 106 being joined thereto, and FIG. 5 shows cladding system 100 after substrate 102 and cladding 106 have been joined.

With continued reference to FIGS. 1 and 5, interlock surface features 104 include receptacles 108 in the substrate with BMG material 106 therein, e.g. receptacles 108 are the troughs between the peaks 110 of interlock surface features 104. For sake of clarity, not all of the peaks or receptacles are labeled in the Figures. Receptacles 108 narrow in a direction going deeper within the substrate 102. The interlock surface features 104 with receptacles for BMG material form a repeating pattern of substantially identical triangular receptacles 108. It is also contemplated that an alternating pattern of two sets of different triangular receptacles 208 and 209 can be used, such as in interlock surface features 204 of cladding system 200 of FIGS. 2 and 6, which includes a substrate 102 and cladding 106 much as described above with respect to FIGS. 1 and 5.

Figure 3:
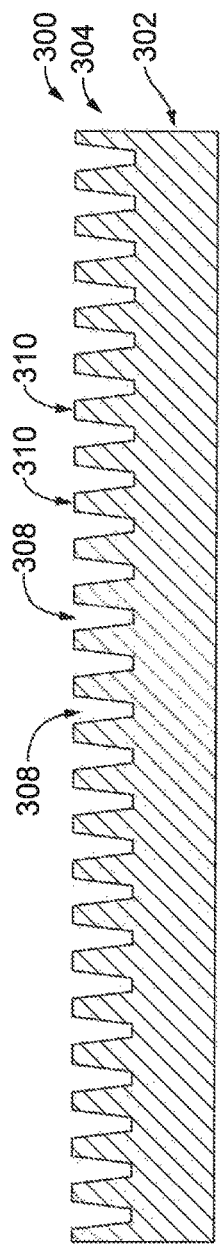

With reference to FIGS. 3 and 7, substrate 302 and cladding 306 of cladding system 300 are much as described above with respect to FIGS. 1 and 5. Interlock surface features 304 include receptacles that form a repeating pattern of substantially identical truncated triangular receptacles 308 with truncated triangular peeks or teeth 310 separating each respective adjacent pair of the receptacles 308.

Figure 4:
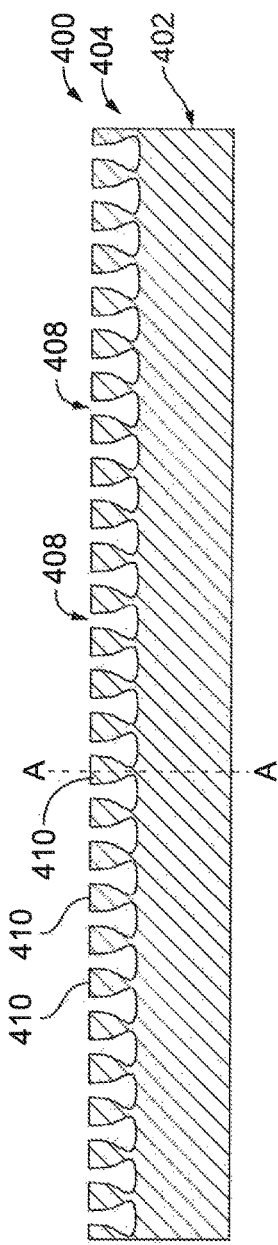

Referring now to FIGS. 4 and 8, cladding system 400 has a substrate 402 that includes interlock surface features 404 with receptacles 408 that widen in a direction going deeper within the substrate 402. Each tooth 410 narrows down in a direction going deeper within the substrate 402 and is symmetrical with respect to neighboring ones of the receptacles 408, i.e., each tooth 410 is symmetrical across a respective tooth axis A half way between the two adjacent receptacles 408 as indicated in FIG. 4.

It is also contemplated that receptacles that have a uniform dimension going deeper within the substrate, e.g., that neither widen nor narrow, can be used, similar to the truncated triangle pattern in FIG. 3, but more rectangular. Cladding 406 is joined to substrate 402 much as described above with respect to FIGS. 1 and 5. Those skilled in the art will readily appreciate that any other suitable pattern can be used for the interlock surface features without departing from the scope of this disclosure.

The substrates 102, 202, 302, and 402 are each joined to a respective second substrate 103, 203, 303, and 403 by the respective BMG material 106, 206, 306, and 406, as shown in FIGS. 9-12, respectively. The BMG materials 106, 206, 306, and 406 interlock with the interlock surface features of both the first and second substrates, and each BMG material forms a layer between the respective first and second substrates that is less than or equal to a typical thickness of 2.0 mm thick, but could be up to 10 mm thick or more, if the particular BMG material and deposition process permit. This thickness, t, is shown in FIGS. 9-12, and represents the thickness measured from the peaks of the interlock surface features 104, 204, 304, and 404 of the first substrate, respectively, to the opposed peaks 104, 204, 304, and 404 of the interlock features of the second substrate 103, 203, 303, and 403, respectively. In each of FIGS. 9-12, the first and second substrates are configured with matching interlock surface features, however, those skilled in the art will readily appreciate that mismatched interlock surface features can also be used for a first and second substrate without departing from the scope of this disclosure. Moreover, those skilled in the art will readily appreciate that the interlocking features described above are examples and that any other suitable interlocking features can be used or formed, e.g., by methods such as grit blasting, laser processing, electrical discharge machining (EDM), mechanical grinding, chemical etching, or the like.

A method of forming a bulk metallic glass (BMG) cladding includes bringing a BMG material to a temperature lower than the crystallization temperature of the BMG material, and at least in some embodiments greater than or equal to the glass transition temperature of the BMG material and lower than the crystallization temperature of the BMG material. For example, the BMG material can be placed in contact with the substrate with the BMG at room temperature and then the BMG can be heated up to the glass transition temperature ($T_g$) in order to thermoplastically form the BMG material into the interlock surface features of the substrate. This could be done in a hot press or an autoclave, for example. It is also contemplated that the BMG material need not necessarily be required to be above the glass transition temperature during the initial stages of depositing. For example, in cold spraying the BMG material onto the substrate, the energy associated with accelerating particles of the BMG material to the substrate may be transformed into heat upon impact (so the particles of BMG material are not above Tg until impact).

The method also includes depositing the BMG material onto a substrate, e.g., substrate 102, 202, 302, and 402, with interlock surface features, e.g., interlock surface features 104, 204, 304, and 404, such that the BMG material interlocks with the interlock surface features of the substrate. The method also includes joining a second substrate, e.g., substrate 103, 203, 303, and 403, to the BMG material, wherein the second substrate includes interlock surface features such that the BMG material interlocks with the interlock surface features of both the first and second substrates, joining the first and second substrates together to produce a fully amorphous joint between the first and second substrates.

The method can include depositing a portion of the BMG material onto the second substrate such that the portion of the BMG material interlocks with the interlock surface features of the second substrate prior to joining the first and second substrates. For example, this could be done by forming two cladded substrates 102 as shown in FIG. 5 as the first and second substrates. Joining the first and second substrates can include forming a BMG to BMG bond between the portion of the BMG material deposited on the second substrate, and the BMG material deposited on the first substrate.

The method can include forming the interlock surface features on a surface of at least one of the first or second substrates, e.g., prior to depositing the BMG material onto the substrate. In one example, anodic aluminum oxide structures can be formed on aluminum-bearing alloys to form interlock surface features with narrow, uniform tubule type structures. The interlock surface features can also be performed using chemical means or any other suitable technique. The interlock surface features can be formed of the same or different material than the substrate, and can be formed through any suitable methods such as chemical reaction(s), deposition/additive processes, and/or subtractive machining type operations. Those skilled in the art having the benefit of this disclosure will readily appreciate that the technique for forming the interlock surface features can be selected on an application by application basis to provide the desired BMG performance. For example, in the case of anodic aluminum oxide mentioned above, the oxide could provide the interlock features, but also may electrically and chemically isolate the substrate from the clad BMG material which could be important for corrosion applications.

It is also contemplated that the surface interlock features may already be present in a substrate, without a specific need to form them. For example, if a composite material is used for the substrate, a rough surface of a polymer matrix composite may provide sufficient repeating surface features to provide the interlock surface features used for interlocking with the BMG material. The interlock surface features can include at least one of anodized aluminum or titanium.

Depositing the BMG material can include any suitable process such as at least one of thermoplastic forming, rolling, compression molding, autoclaving, cold spraying, thermal spraying, or hot pressing the BMG material onto the substrate such that the BMG material interlocks with the interlocking surface features of the substrate. Any other suitable deposition process or combination of processes can be used. For example, if a sheet of stock BMG is used, it can be brought to within the temperature range described above, and can then be rolled, compression molded, hot pressed, vacuum formed, autoclaved, or formed using any suitable plastic forming process, onto the substrate so that the BMG material flows into and interlocks with the interlock surface features mechanically. It is also contemplated that the BMG can be cold sprayed or thermal sprayed onto the substrate such that the BMG material interlocks with the interlocking surface features, e.g., wherein the BMG material is delivered to the substrate with the BMG material within the temperature range described above. It is also contemplated that the initial stage of depositing does not actually include flowing BMG material into the interlocking features, which flowing may occur after the initial deposition. For example, BMG material can be deposited onto a substrate up to a desired thickness via a process like cold spray, and subsequently the BMG material could be heated and rolled to provide the flowing into the interlock surface features.

If the BMG material cools to a temperature below the glass transition temperature ($T_g$) after joining to the first substrate but before joining to the second substrate, the BMG material should be brought back to a temperature above the glass transition temperature ($T_g$) and below the crystallization temperature ($T_x$) for joining to the second substrate.

Those skilled in the art will readily appreciate that BMG clad layers as described herein can be used in any suitable application without departing from the scope of this disclosure. BMG materials can offer significant benefits in terms of corrosion resistance, elastic storage modulus and ease of forming complex shapes. For example, direct replacement of titanium with a material that can be processed like a polymer, but has properties significantly better than most metallic engineering alloys, would offer a significant cost savings in manufacturing and machining of complex geometries.

Using BMG materials as described herein to join two substrates can replace braze joints, welds, and polymeric adhesives in joining materials, e.g. joining two dissimilar materials, wherein the joints are often mechanically weaker than the substrates they are joining. A potential advantage of techniques disclosed herein is that high strength and corrosion resistant material can be used to bond may different types of substrates, including polymers, metals, and ceramics. There is also a potential ability to fill into complex geometries without having to melt the joint material—this can minimize chemical and microstructural changes of the base substrate which is generally an issue for soldered, brazed, and welded joints. The techniques described herein can provide for a highly elastic joint relative to traditional techniques—typical metals have an elastic limit of 0.2%-0.65%, whereas BMG materials can have elastic limits of 2%-3%. Another potential advantage of techniques described herein is the ability to re-work joints by warming the joint back up to a temperature between the glass transition temperature ($T_g$) and the crystallization temperature ($T_x$).

The methods and systems of the present disclosure, as described above and shown in the drawings, provide for components with superior properties including joining techniques and the resulting systems or structures with the advantageous properties of Bulk Metallic Glass (BMG) materials on structures having an underlying substrates of a non-BMG material. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of joining comprising:
   bringing a bulk metallic glass (BMG) material to a temperature lower than the crystallization temperature of the BMG material;
   depositing the BMG material onto a first substrate with interlock surface features such that the BMG material interlocks with the interlock surface features of the substrate; and
   joining a second substrate to the BMG material, wherein the second substrate includes interlock surface features such that the BMG material interlocks with the interlock surface features of both the first and second substrates, joining the first and second substrates together to produce a fully amorphous joint between the first and second substrates, further comprising forming the interlock surface features on a surface of at least one of the first or second substrates, wherein forming the interlock surface features includes forming interlock surface features with receptacles for BMG material that narrow in a direction going deeper within the substrate, wherein forming the interlock surface features includes forming interlock surface features with receptacles for BMG material that form a repeating pattern of substantially identical triangular receptacles with triangular cross-sections in side elevation.

2. The method as recited in claim 1, wherein depositing the BMG material includes at least one of thermoplastic forming, rolling, compression molding, hot pressing, autoclaving, thermal spraying, or cold spraying the BMG material onto the substrate such that the BMG material interlocks with the interlocking surface features of the substrate.

3. The method as recited in claim 1, wherein bringing the BMG material to a temperature lower than the crystallization temperature of the BMG material includes bringing a BMG material to a temperature greater than or equal to the glass transition temperature of the BMG material and lower than the crystallization temperature of the BMG material.

4. The method as recited in claim 1, further comprising depositing a portion of the BMG material onto the second substrate such that the portion of the BMG material interlocks with the interlock surface features of the second substrate prior to joining the first and second substrates, wherein joining the first and second substrates includes forming a BMG to BMG bond between the portion of the BMG material deposited on the second substrate, and the BMG material deposited on the first substrate.

5. A method of joining comprising:
bringing a bulk metallic glass BMG material to a temperature lower than the crystallization temperature of the BMG material;
depositing the BMG material onto a first substrate with interlock surface features such that the BMG material interlocks with the interlock surface features of the substrate; and
joining a second substrate to the BMG material, wherein the second substrate includes interlock surface features such that the BMG material interlocks with the interlock surface features of both the first and second substrates, joining the first and second substrates together to produce a fully amorphous joint between the first and second substrates, further comprising forming the interlock surface features on a surface of at least one of the first or second substrates, wherein forming the interlock surface features includes forming interlock surface features with receptacles for BMG material that narrow in a direction going deeper within the substrate, wherein forming the interlock surface features includes forming interlock surface features with receptacles for BMG material that form an alternating pattern of two sets of receptacles with differently oriented triangular cross-sections in side elevation pointed in opposite directions from each other.

6. A method of joining comprising:
bringing a bulk metallic glass (BMG) material to a temperature lower than the crystallization temperature of the BMG material;
depositing the BMG material onto a first substrate with interlock surface features such that the BMG material interlocks with the interlock surface features of the substrate; and
joining a second substrate to the BMG material, wherein the second substrate includes interlock surface features such that the BMG material interlocks with the interlock surface features of both the first and second substrates, joining the first and second substrates together to produce a fully amorphous joint between the first and second substrates, further comprising forming the interlock surface features on a surface of at least one of the first or second substrates, wherein forming the interlock surface features includes forming interlock surface features with receptacles for BMG material that narrow in a direction going deeper within the substrate, wherein forming the interlock surface features includes forming interlock surface features with receptacles for BMG material that form a repeating pattern of substantially identical receptacles with truncated triangular teeth cross-sections in side elevation separating each respective adjacent pair of the receptacles.

* * * * *